(12) United States Patent
Nagasawa et al.

(10) Patent No.: US 11,346,018 B2
(45) Date of Patent: May 31, 2022

(54) SILICON CARBIDE SUBSTRATE PRODUCTION METHOD AND SILICON CARBIDE SUBSTRATE

(71) Applicants: Shin-Etsu Chemical Co., Ltd., Tokyo (JP); CUSIC Inc., Sendai (JP)

(72) Inventors: Hiroyuki Nagasawa, Sendai (JP); Yoshihiro Kubota, Annaka (JP); Shoji Akiyama, Annaka (JP)

(73) Assignees: Shin-Etsu Chemical Co., Ltd., Tokyo (JP); CUSIC Inc., Sendai (JP)

( * ) Notice: Subject to any disclaimer, the term of this patent is extended or adjusted under 35 U.S.C. 154(b) by 11 days.

(21) Appl. No.: 16/489,814

(22) PCT Filed: Mar. 1, 2018

(86) PCT No.: PCT/JP2018/007755
§ 371 (c)(1),
(2) Date: Aug. 29, 2019

(87) PCT Pub. No.: WO2018/159754
PCT Pub. Date: Sep. 7, 2018

(65) Prior Publication Data
US 2019/0382918 A1 Dec. 19, 2019

(30) Foreign Application Priority Data
Mar. 2, 2017 (JP) .............................. JP2017-039243

(51) Int. Cl.
*C30B 29/36* (2006.01)
*C30B 25/18* (2006.01)
(Continued)

(52) U.S. Cl.
CPC ............ *C30B 29/36* (2013.01); *C23C 16/325* (2013.01); *C30B 25/18* (2013.01); *C30B 33/10* (2013.01);
(Continued)

(58) Field of Classification Search
CPC ....... C23C 16/325; C30B 25/18; C30B 29/36; C30B 33/10; H01L 21/02529;
(Continued)

(56) References Cited

U.S. PATENT DOCUMENTS

| | | | | |
|---|---|---|---|---|
| 4,983,538 A | * | 1/1991 | Gotou | ............... H01L 29/66068 438/459 |
| 2004/0067370 A1 | * | 4/2004 | Ebata | ..................... H01L 22/34 428/446 |
| 2016/0204023 A1 | | 7/2016 | Imaoka et al. | |

FOREIGN PATENT DOCUMENTS

| | | |
|---|---|---|
| JP | 3-97691 A | 4/1991 |
| JP | 7-335562 A | 12/1995 |

(Continued)

OTHER PUBLICATIONS

JP-11147766-A Translation (Year: 1999).*
(Continued)

*Primary Examiner* — Hua Qi
(74) *Attorney, Agent, or Firm* — WHDA, LLP (57) ABSTRACT

A silicon carbide substrate production method includes: the step of providing covering layers 1*b*, 1*b*, each containing silicon oxide, silicon nitride, silicon carbonitride, or silicide, respectively on both surfaces of a base material substrate 1*a* carbon, silicon or silicon carbide, and turning the surface of each of the covering layers 1*b*, 1*b* into a smooth surface to prepare a support substrate 1; a step of forming a polycrystalline silicon carbide film 10 on both surfaces of the support substrate 1 by a gas phase growth method or a liquid phase growth method; and a step of separating the polycrystalline silicon carbide films from the support substrate while preserving, on the surface thereof, the smoothness of the covering layer surfaces 1*b*, 1*b* by chemically removing at
(Continued)

least the covering layers 1b, 1b, from the support substrate 1. The silicon carbide substrate has a smooth surface and reduced internal stress.

4 Claims, 6 Drawing Sheets

(51) Int. Cl.
- *C30B 33/10* (2006.01)
- *H01L 21/02* (2006.01)
- *H01L 21/683* (2006.01)
- *H01L 29/16* (2006.01)
- *C23C 16/32* (2006.01)

(52) U.S. Cl.
CPC .... *H01L 21/0262* (2013.01); *H01L 21/02529* (2013.01); *H01L 21/02595* (2013.01); *H01L 21/6835* (2013.01); *H01L 29/1608* (2013.01); *H01L 2221/68345* (2013.01); *H01L 2221/68381* (2013.01)

(58) Field of Classification Search
CPC ........... H01L 21/02595; H01L 21/0262; H01L 21/205; H01L 21/6835; H01L 2221/68345; H01L 2221/68381; H01L 29/1608

See application file for complete search history.

(56) References Cited

FOREIGN PATENT DOCUMENTS

| | | | |
|---|---|---|---|
| JP | 9-221395 | A | 8/1997 |
| JP | 10-223870 | A | 8/1998 |
| JP | 11-147766 | A | 6/1999 |
| JP | 2003-282664 | A | 10/2003 |
| JP | 2005-255420 | A | 9/2005 |
| JP | 2007-273524 | A | 10/2007 |
| JP | 2008-230944 | A | 10/2008 |
| JP | 2013-216514 | A | 10/2013 |
| JP | 2015-15401 | A | 1/2015 |
| JP | 2015-211047 | A | 11/2015 |
| JP | 2016-18890 | A | 2/2016 |
| JP | 2016-155 697 | A | 9/2016 |

OTHER PUBLICATIONS

JP-09221395-A Translation (Year: 1997).*
Nagasawa et al., "Heteroepitaxial Growth of 3C—SiC on Si Substrates," Journal of the Japanese Association for Crystal Growth, vol. 24, No. 3 (1997), pp. 270-286, with English absliact, cited in the specification.
International Search Report dated Apr. 24, 2018, issued in counterpart International Application No. PCT/JP2018/007755 (1 page).
Chichignoud et al., "High temperature processing of poly-SiC subsliates from the vapor phase for wafer-bonding," Surface & Coatings Technology, 2006, vol. 201, pp. 4014-4020, cited in ISR.

* cited by examiner

SILICON CARBIDE SUBSTRATE PRODUCTION METHOD AND SILICON CARBIDE SUBSTRATE

TECHNICAL FIELD

The present invention relates to a method for producing a silicon carbide substrate having a flat and smooth surface, and to a silicon carbide substrate.

BACKGROUND ART

A single crystal Si substrate has been used so far as a main substrate for a dummy wafer of a semiconductor process, a mold material for nanoimprinting or the like, a mirror, a membrane material for X-ray lithography, or micro electro mechanical systems (MEMS), however, the application has been limited because the mechanical strength, the chemical durability, and the heat resistance are insufficient. Recently, as a substrate used for the application, a silicon carbide substrate that is excellent in the heat resistance, and the mechanical properties, and is resistant to radiation has been attracting attention.

The substrate to be used for the application is required to have a smoothness such that the total thickness variation (TTV) is 50 μm or less and the arithmetic mean roughness Ra is less than 1 nm.

In this regard, in a case where a single crystal silicon carbide substrate is used for the application, the production cost of the single crystal silicon carbide substrate is high, and if a thermal process or the like is performed, a problem that dislocation in the crystal glides to cause deformation of the substrate is generated.

On the other hand, a polycrystalline silicon carbide substrate can be produced relatively inexpensively, and further since the polycrystalline silicon carbide substrate contains a large number of crystal grain boundaries, the glide of dislocation is blocked, and the deformation of the substrate is suppressed even after the thermal process is performed. However, when chemical-mechanical polishing (CMP) is applied onto a surface of a substrate in order to obtain a smooth surface, a problem that the smoothness on the surface is impaired is caused. This is because in a polycrystalline silicon carbide substrate, polar faces being different from each other and crystal orientation planes being different from each other are mixed and exposed on the surface, and the polishing rates and the etching rates differ in the respective faces and planes.

Further, recently, there are also several trials to produce a high-performance power semiconductor by bonding a thin film of single crystal silicon carbide on an inexpensive polycrystalline silicon carbide substrate (see, for example, JP-A 2015-15401 (Patent Document 1)).

In a direct bonding method, the surface roughness of a bonding surface is required to be extremely small, and in this invention, by modifying a bonding surface to form an amorphous layer on the surface, the desired bonding strength can be obtained even in a case where the surface roughness is larger than the surface roughness to be required on a bonding surface in a direct bonding method. However, in this invention, the substrate surface is irradiated with a neutral atom beam of argon to destroy the crystal structure from the surface up to a certain depth to form an amorphous layer, and bonding of the amorphous layer is performed, and then a heat treatment at 1,000° C. or more is performed so that a space between contact surfaces is filled with the amorphous layer having fluidity, that is, a special treatment is required. Accordingly, a polycrystalline silicon carbide substrate having an extremely small surface roughness of a bonding surface, which can produce a laminated substrate in which a thin film of single crystal silicon carbide is simply bonded to a polycrystalline silicon carbide substrate by a direct bonding method, is desired.

Further, the following techniques have been disclosed with respect to the smoothing and planarizing of a silicon carbide substrate.

In JP-A 2015-211047 (Patent Document 2), a method for polishing a silicon carbide substrate, in which the silicon carbide substrate is fixed so that the surface to be polished of the silicon carbide substrate is attached to a conductive surface table by sandwiching a gap-forming material, polishing grains, and an electrolyte solution containing an electrolyte between the surface to be polished and the conductive surface table, and by using the surface of the silicon carbide substrate as an anode and the conductive surface table as a cathode, the electrolytic polishing is performed on the silicon carbide substrate while bringing at least a part of the surface to be polished of the silicon carbide substrate into contact with the electrolyte solution, has been provided.

Further, in JP-A 2016-155697 (Patent Document 3), a flattening method of a silicon carbide substrate, in which a working electrode and a counter electrode are arranged in a first solution tank of a two-tank type solution vessel by using a potentiostat while a reference electrode is arranged in a second solution tank, and in a device configuration for controlling potential of the first and second solution tanks by a salt bridge, a surface of the silicon carbide substrate immersed and arranged in the first solution tank is polished by a rotatable flat catalyst electrode disposed on the working electrode, has been provided.

However, there are some concerns, for example, that the processing processes become complicated, that the processing quality changes due to the electric conductivity, and that pits are generated at locations of crystal defects.

In JP-A 2008-230944 (Patent Document 4), there has been described that a single crystal silicon carbide substrate in which unstable sites including crystal defects or a damaged layer generated during polishing of the substrate surface exists is subjected to a heat treatment at temperature of 1,500° C. or more and 2,300° C. or less in a high vacuum environment to carbonize the surface and the vicinity thereof of the single crystal silicon carbide substrate and to form a carbonized layer, next, the resulting single crystal silicon carbide substrate is heat treated under saturated vapor pressure of silicon to form a sacrificial growth layer made of amorphous silicon carbide in a part of the carbonized layer and at the same time, to perform thermal etching by sublimating the amorphous silicon carbide layer (second process), a flat surface of the single crystal silicon carbide in which the unstable sites are self-restored can be exposed, and then by further applying slightly thermal etching to the resulting single crystal silicon carbide, an extremely flattened (stabilized) single crystal silicon carbide substrate can be obtained. However, in this method, since thermal stress is applied to the silicon carbide, movement and extension of defects in the crystal are promoted, and a problem that the desired quality cannot be obtained is concerned.

In JP-A H11-147766 (Patent Document 5), in silicon carbide sintered bodies made of polycrystals, a silicon carbide sintered body whose polished surface has a surface roughness of 3 nm or less in a center line average roughness (Ra) by a contact-type measuring method has been provided. In order to produce the silicon carbide sintered body, a method for producing a silicon carbide sintered body, in which 0.1 to 0.8% by weight of boron or a compound of boron and 1 to 5% by weight of carbon are added as sintering auxiliaries to a silicon carbide powder having an average particle diameter of 0.7 μm or less, the mixture is molded, the molded product is sintered in an inert gas atmosphere of 1,900 to 2,050° C. at the atmospheric pressure, and then the sintered product is subjected to a hot isostatic pressing (HIP) treatment at a lower temperature than the sintering temperature under a pressure of 1,000 kg/cm$^2$ or more, and subsequently the surface of the obtained HIP treatment product is polished with diamond abrasive grains having an average particle diameter of 2 μm or less, has also been disclosed. However, there are some problems, for example, that the production processes become complicated, that the quality of crystal is deteriorated due to the high temperature treatment, that the grain size of the surface is limited, and that boron is incorporated as an impurity.

Several structures and methods have been provided also with respect to the stress reduction of a silicon carbide substrate.

For example, in JP-A 2013-216514 (Patent Document 6), a device for producing a silicon carbide single crystal, which is provided with a third heat insulating material such that the third heat insulating material protrudes from an inner peripheral wall surface of a heating vessel while surrounding a pedestal to be pulled up by rotation, has been disclosed. With this arrangement, the temperature of the outer edge part of the silicon carbide single crystal can be pulled to a temperature of the third heat insulating material, and generation of a recessed shape of the growth surface of the silicon carbide single crystal can be suppressed. Therefore, generation of stress inside a crystal of the silicon carbide single crystal can be suppressed, and the deterioration of quality by generation of crystal defects (dislocation) or the like can be prevented. However, not a little influence of the stress generated due to the arrangement of the silicon carbide crystal and a heat insulating material, the temperature, or the like, is received, and therefore, in order to reduce the stress, it is required to control of the precise shape and the temperature.

Further, in JP-A H09-221395 (Patent Document 7), in a polycrystalline silicon carbide film formed on a base body, the silicon carbide film characterized by being formed via a polycrystalline thin film coated on a surface of the base body, has been disclosed. However, it is not easy to make the orientation of crystal grains of the polycrystalline thin film coated on the surface of the base body isotropic, and further a problem that the smoothness of the surface of the polycrystalline silicon carbide film is influenced by the surface roughness of the polycrystalline thin film coated on the surface of the base body is generated.

PRIOR ART DOCUMENTS

Patent Documents

Patent Document 1: JP-A 2015-15401
Patent Document 2: JP-A 2015-211047
Patent Document 3: JP-A 2016-155697
Patent Document 4: JP-A 2008-230944
Patent Document 5: JP-A H11-147766
Patent Document 6: JP-A 2013-216514
Patent Document 7: JP-A H09-221395
Patent Document 8: JP-A H07-335562
Patent Document 9: JP-A 2016-18890

Non Patent Document 1: "Heteroepitaxial Growth of 3C—SiC on Si Substrates"Hiroyuki Nagasawa, Kuniaki Yagi, Journal of the Japanese Association for Crystal Growth, Vol. 24, No. 3 (1997), p. 270-286

SUMMARY OF INVENTION

Technical Problem

The present invention has been made to address the problems mentioned above, and an object of the present invention is to provide a method for producing a silicon carbide substrate with which the surface is smooth and flat and further the reduction of internal stress is realized, and a silicon carbide substrate.

Solution to Problem

By the way, if a smooth substrate (base substrate) is prepared in advance, polycrystalline silicon carbide is deposited on both surfaces of the substrate, and then the base substrate is removed, the surface of the polycrystalline silicon carbide that has been in contact with the base substrate can be expected to have the smoothness equivalent to that on the surface of the base substrate. For example, it has been considered that if a Si wafer is used as a base substrate, the surface roughness equivalent to that on the surface of the Si wafer (for example, arithmetic mean roughness Ra<1 nm) can be obtained on the surface of the polycrystalline silicon carbide that has been in contact with the base substrate (replica of the surface of Si wafer). Further, it is expected that, for example, if a silicon substrate is prepared, silicon carbide is deposited on the silicon substrate, and then the silicon substrate is removed by etching, or the like, a free standing (self-standing) silicon carbide substrate is obtained, and on a surface that has been in contact with the silicon substrate, a surface having the smoothness equivalent to that of the surface of the silicon substrate can be obtained.

In addition, in JP-A H07-335562 (Patent Document 8), a method for forming a silicon carbide film, which is characterized by including a step of forming a surface carbonized layer made of single crystal silicon carbide by carbonizing the surface of a single crystal silicon substrate in an atmosphere of carbon, a step of separating the surface carbonized layer from the silicon substrate, and a step of depositing silicon carbide from the source gas of silicon and the source gas of carbon with the surface carbonized layer separated from the silicon substrate as a substrate, has been provided.

Figure 14A:
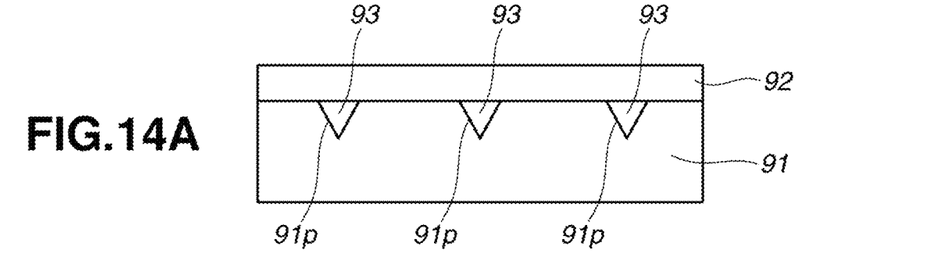
FIG. 14A is a sectional view showing a state that a silicon carbide film is formed on a silicon substrate having etch pits.
Figure 14B:
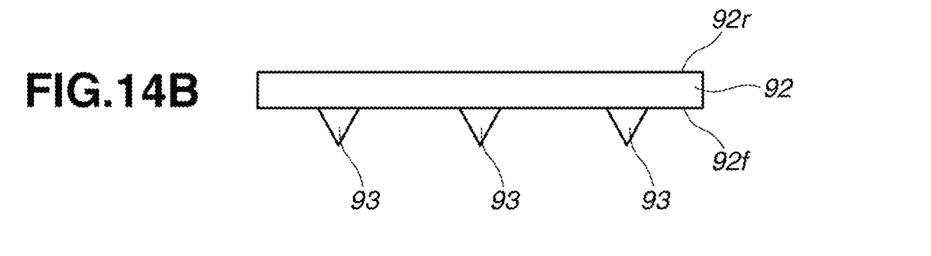
FIG. 14B is a sectional view showing a state that the silicon carbide film is taken out as a silicon carbide substrate.

However, as described in Non Patent Document 1 (Journal of the Japanese Association for Crystal Growth, Vol. 24, No. 3 (1997), p. 270-286), in a high temperature environment in which silicon carbide is deposited, the surface of the Si wafer is etched, thermally roughened, or carbonized, and the initial smoothness is impaired, and as a result, the smoothness on the surface of polycrystalline silicon carbide is also impaired. For this reason, as shown in FIGS. 14A and 14B, before a silicon carbide film 92 is deposited and formed on a silicon substrate 91, etch pits 91$p$ are generated on the silicon substrate 91, the replica is transferred onto the front surface 92$f$ of the free-standing silicon carbide substrate (silicon carbide film 92), and protrusions 93 are formed on the front surface 92$f$, and thus an expected smooth surface has not been obtained.

By preparing a base substrate made of carbon, depositing polycrystalline silicon carbide on the substrate, and then oxidizing and removing the carbon substrate, it is possible to avoid the deterioration of smoothness due to the thermal roughening and the carbonization. However, depending on the production method and the bulk density of the carbon substrate, there is a concern of a problem that the base substrate made of carbon is impregnated with the Si in the deposition atmosphere during the deposition of polycrystalline silicon carbide, and the deformation is caused.

Further, it is conceivable to use a silicon carbide substrate itself as the base substrate, it is difficult to polish the surface of polycrystalline silicon carbide until the smoothness of an arithmetic mean roughness Ra of 1 nm or less is obtained, or there is no means for selectively separating and taking out the same kind of polycrystalline silicon carbide as that of the base substrate, and therefore, it cannot be regarded as a practical method.

In addition to this, in a case where a Si wafer or a silicon carbide substrate is used as the base substrate, a deposited layer that should be originally polycrystalline silicon carbide is unintentionally formed by epitaxial growth, and a problem that single crystals are generated and the deformation is easily caused is also induced.

Further, in JP-A 2016-18890 (Patent Document 9), a method for producing a silicon carbide wafer, including: a step of preparing a silicon carbide composite substrate having a glassy carbon layer on a surface of a silicon carbide base material and a CVD-silicon carbide layer on the glassy carbon layer, and a single crystal silicon carbide substrate having an ion implanted layer where a hydrogen ion is implanted onto the surface; a bonding step of affixing the CVD-silicon carbide layer of the silicon carbide composite substrate and the ion implanted layer of the single crystal silicon carbide substrate to obtain a bonded body; a first separation step of heating the bonded body to separate the ion implanted layer from the single crystal silicon carbide substrate to obtain a single crystal covered substrate; and a second separation step of separating the glassy carbon layer and the CVD-silicon carbide layer of the single crystal deposited substrate to obtain a silicon carbide wafer has been provided. However, it is difficult to soften and smooth the glassy carbon layer, it is also difficult to planarize the glassy carbon layer by CMP, and therefore, it is difficult to obtain a smooth silicon carbide wafer by the separation.

And what is worse, the carbon layer is not sufficiently resistant to the oxidizing atmosphere, and therefore, the surface may be roughened when the CVD-silicon carbide layer is formed.

The present inventors have intensively studied on the basis of the above findings, and thus have completed the present invention.

That is, the present invention provides the following method for producing a silicon carbide substrate, and a silicon carbide substrate.

[1] A method for producing a silicon carbide substrate, comprising steps of: providing covering layers each containing silicon oxide, silicon nitride, silicon carbonitride or silicide on both surfaces of a base substrate made of carbon, silicon or silicon carbide to prepare a support substrate having the covering layers each with a smooth surface;
forming polycrystalline silicon carbide films on both surfaces of the support substrate by a vapor deposition method or a liquid phase growth method; and
chemically removing at least the covering layers in the support substrate to separate the polycrystalline silicon carbide films from the support substrate in a state of reflecting a smoothness of surfaces of the covering layers to the surfaces of the polycrystalline silicon carbide films, and obtaining the polycrystalline silicon carbide films as silicon carbide substrates each having a crystal grain size of 10 nm or more and 10 μm or less, and an arithmetic mean roughness Ra of at least one of its main surfaces of 0.3 nm or less.

[2] The method for producing a silicon carbide substrate described in [1], wherein the support substrate is prepared by smoothing both surfaces of the base substrate, forming covering layers made of silicon oxide, silicon nitride, silicon carbonitride or silicide on the both surfaces of the base substrate, and reflecting smooth surfaces of the base substrate to surfaces of the covering layers.

[3] The method for producing a silicon carbide substrate described in [1], wherein the support substrate is prepared by forming covering layers made of phospho silicate glass or boro-phospho silicate glass on both surfaces of the base substrate, and reflowing the covering layers to be smooth surfaces of the covering layers.

[4] The method for producing a silicon carbide substrate described in any one of [1] to [3], wherein the polycrystalline silicon carbide films are formed by a thermal CVD method.

[5] A silicon carbide substrate, including a vapor deposition film or a liquid phase deposition film of polycrystalline silicon carbide, the silicon carbide substrate having a crystal grain size of 10 nm or more and 10 μm or less, and an arithmetic mean roughness Ra of at least one of its main surfaces of 0.3 nm or less.

[6] The silicon carbide substrate described in [5], wherein the silicon carbide substrate is constituted of at least one of a cubic crystal and a hexagonal crystal, and a volume of crystal grains in which a close-packed plane is oriented at a solid angle within $\frac{1}{3}\pi$ steradian from a normal axis of a main surface of the substrate is half or less of a volume of total constituent crystal grains.

[7] The silicon carbide substrate described in [5] or [6], wherein a value of BOW of the substrate is −30 μm or more and 30 μm or less if a diameter of the substrate is 6 inches.

Advantageous Effects of Invention

According to the present invention, a polycrystalline silicon carbide film is formed on a covering layer of a support substrate having a smooth surface without eroding the covering layer, and therefore, a polycrystalline silicon carbide film having a surface reflecting the smooth surface of the support substrate can be obtained as a silicon carbide substrate.

BRIEF DESCRIPTION OF DRAWINGS

FIGS. 1A to 1D are a set of views showing steps of one embodiment of the method for producing a silicon carbide substrate according to the present invention.

FIGS. 14A and 14B are two sectional views showing a production example of a conventional silicon carbide substrate.

DESCRIPTION OF EMBODIMENTS

Method for Producing Silicon Carbide Substrate

Hereinafter, the method for producing a silicon carbide substrate according to the present invention is described.

The method for producing a silicon carbide substrate according to the present invention includes: a step of providing covering layers each containing silicon oxide, silicon nitride, silicon carbonitride or silicide on both surfaces of a base substrate made of carbon, silicon or silicon carbide to prepare a support substrate having the covering layers each with a smooth surface; a step of forming polycrystalline silicon carbide films on both surfaces of the support substrate by a vapor deposition method or a liquid phase growth method; and a step of obtaining a polycrystalline silicon carbide film taken out by chemically removing the entire support substrate, or a polycrystalline silicon carbide film separated from the base substrate by chemically removing the covering layers in the support substrate as a silicon carbide substrate having a crystal grain size of 10 nm or more and 10 μm or less, and an arithmetic mean roughness Ra of at least one of its main surfaces of 0.3 nm or less.

Hereinafter, an embodiment of the method for producing a silicon carbide substrate according to the present invention is described with reference to FIGS. 1A to 1D.

(Step 1)

Figure 1A:
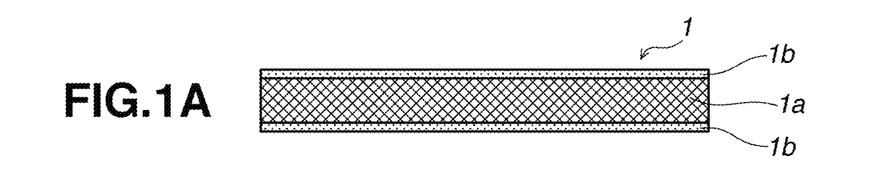
FIG. 1A is a sectional view of a support substrate obtained by providing covering layers on both surfaces of a base substrate.

Covering layers 1b and 1b that are each a film containing silicon oxide, silicon nitride, silicon carbonitride or silicide are provided on both surfaces of a base substrate 1a made of carbon, silicon, or silicon carbide, and a support substrate 1 having the covering layers 1b and 1b each with a smooth surface is prepared (FIG. 1A).

In this regard, the base substrate 1a is a substrate having uniform thickness and made of carbon, silicon, or silicon carbide. For example, as the base substrate 1a, a high-purity carbon substrate, a silicon (Si) wafer, or a silicon carbide substrate can be mentioned.

The size of the main surface of the base substrate 1a corresponds to the size of the silicon carbide substrate to be finally obtained, and may be appropriately selected from, for example, a diameter of 3 inches, 6 inches or the like. Further, it is preferred that the thickness of the base substrate 1a is thick enough to ensure the sufficient strength to support the silicon carbide film to be described later, and is thin enough to be easy to perform the removal to be described later, and the thickness is, for example, preferably 100 to 1,000 μm, and more preferably 300 to 700 μm.

The covering layer 1b is a film made of a material having low reactivity with a raw material (source gas in a case of a chemical vapor deposition method) to be used in forming a polycrystalline silicon carbide film, which is performed later, and containing silicon oxide, silicon nitride, silicon carbonitride or silicide, and is for suppressing undesirable etching or carbonization reaction of the base substrate 1a in forming the polycrystalline silicon carbide film. Further, the covering layer 1b is a film made of a material that can be chemically removed without affecting the polycrystalline silicon carbide film after the formation of the polycrystalline silicon carbide film.

In this regard, the covering layer 1b may contain other sub-component materials in addition to the main component of silicon oxide, silicon nitride, silicon carbonitride or silicide, as long as the film is a film that is made of a material having low reactivity with a raw material (source gas in a case of a chemical vapor deposition method) to be used in forming a polycrystalline silicon carbide film, which is performed later, and that suppresses undesirable etching or carbonization reaction of the base substrate 1a in forming the polycrystalline silicon carbide film, and is made of a material capable of being chemically removed without affecting the polycrystalline silicon carbide film after the formation of the polycrystalline silicon carbide film.

For example, the expression "covering layer 1b containing silicon oxide" includes not only a covering layer 1b made only of silicon oxide but also a covering layer 1b made of silicon oxide ($SiO_2$) and other glass-forming components, and preferably includes a covering layer 1b made of boro silicate glass (BSG), phospho silicate glass (PSG) or borophospho silicate glass (BPSG), which has reflow properties doped with $B_2O_3$ and/or $P_2O_5$.

Further, the expression "covering layer 1b containing silicon nitride, silicon carbonitride or silicide" includes not only a covering layer 1b made only of silicon nitride, silicon carbonitride or silicide but also a covering layer 1b made of a material containing silicon nitride, silicon carbonitride or silicide, and other sub-component materials that do not inhibit the above characteristics.

As the preferable covering layer 1b, the following ones are mentioned.

For example, in a case where the base substrate 1a is a single crystal silicon substrate, thermal oxide films (silicon oxide films) formed on the front and back surfaces of the substrate by subjecting the silicon substrate to a thermal oxidation treatment may be each used as the covering layer 1b.

Further, a spin on glass (SOG) film is formed on a surface of the base substrate 1a, and the SOG film may be used as the covering layer 1b.

Alternatively, a film made of phospho silicate glass (PSG) (PSG film) or a film made of boro-phospho silicate glass (BPSG) (BPSG film), which is formed by a thermal chemical vapor deposition (CVD) method, may be used as the covering layer 1b.

In addition, a chemical vapor deposition film made of silicon oxide, silicon nitride, silicon carbonitride or silicide may be used as the covering layers 1b.

Further, a metal film is deposited on a silicon substrate by a vapor deposition method or the like, the deposited metal film is further heated to cause a solid-phase reaction, and a silicide of any metal (for example, nickel, cobalt, molybdenum, tungsten, or the like) may be formed as the covering layer 1b.

In this regard, if the covering layer 1b is an amorphous film by selecting the film forming method and the film forming conditions, even if a silicon carbide film is deposited on the amorphous film, a polycrystalline silicon carbide film that is isotropically oriented can be obtained without depending on the deposition method and deposition conditions, and therefore, this is preferred.

The thickness of the covering layer 1b is not particularly limited as long as the smoothness of a surface of the support substrate 1 can be ensured and the covering layer 1b can be chemically removed. The thickness is, for example, preferably 0.01 to 10 μm, and more preferably 0.1 to 1 μm.

The surface of the support substrate 1 is required to have the smoothness at the level required for the silicon carbide substrate because the smoothness is eventually reflected on the surface of the silicon carbide substrate, and the arithmetic mean roughness Ra of the surface is preferably 0.3 nm or less, and more preferably 0.1 nm or less.

In this regard, the arithmetic mean roughness Ra referred to herein is calculated by the formula of arithmetic mean roughness Ra defined in JIS B0601: 2013 on the basis of the surface profile (profile curve) data obtained by measuring a substrate surface to be targeted with a scanning probe microscope (SPM) such as an atomic force microscope (AFM) (that is, an average of absolute values of Z (x) (height of roughness curve at an arbitrary position x) at reference length in the roughness curve) (the same applies to the arithmetic mean roughness Ra described below). In this regard, the surface profile (profile curve) is a profile in a cross-section direction where the texture on a surface of the sample to be targeted is observed, and the unevenness is as large as possible.

In the present invention, two methods are recommended as a method of preparing a support substrate 1 having both surfaces smoothed as described above. The two methods are as follows: a method of preparing a support substrate 1 by smoothing both surfaces of a base substrate 1a, and then forming covering layers 1b and 1b that reflect the smooth surfaces to the extent of the surfaces of the covering layers (method 1); and a method of preparing a support substrate 1 by forming covering layers 1b and 1b on both surfaces of a base substrate 1a, and then reflowing the covering layers 1b and 1b to smooth the surfaces of the covering layers (method 2).

That is, as the method 1, it is preferred that both surfaces of a base substrate 1a, preferably of a base substrate 1a made of carbon or silicon are smoothed, and then, covering layers 1b and 1b are formed on both surfaces of the base substrate 1a, the smooth surfaces of the base substrate 1a are reflected on the surfaces of the covering layers 1b and 1b, and the support substrate 1 is produced.

In this regard, it is preferred that both surfaces of the base substrate 1a made of carbon or silicon are each smoothed by a CMP treatment so as to each have an arithmetic mean roughness Ra of around 0.1 nm. Next, any film mentioned above may be formed as the covering layer 1b. At this time, in a case where the base substrate 1a is a silicon substrate (Si substrate), if the silicon substrate is thermally oxidized, a silicon oxide film that is smooth and uniform can be easily obtained as the covering layer 1b, and therefore, this is preferred. Further, if a chemical vapor deposition method is used, even a film made of any one of silicon oxide, silicon nitride, silicon carbonitride and silicide, can be formed as the covering layer 1b having an arbitrary film thickness, and this is preferred. Alternatively, two silicon carbide substrates having at least one surface smoothed, which have been produced according to the production method of the present invention, are bonded to obtain as one substrate such that the smoothed surfaces are on the outside the one substrate, and this one substrate may be used as the base substrate 1a.

As the method 1, for example, the support substrate 1 is favorably prepared as follows. That is, at first, a single crystal Si substrate having both surfaces polished is prepared. At this time, the arithmetic mean roughness (Ra) of the surface after polishing is set to 0.1 nm or less. Next, the single crystal Si substrate is placed in a thermal oxidation device, and subjected to wet oxidation at 1,100° C. for 300 minutes. By this oxidation, thermal oxide films are formed on both surfaces of the Si substrate as covering layers 1b and 1b. The Ra of the surface of the oxide film is desirably 0.3 nm or less, and more desirably 0.1 nm or less. In order to reflect the smooth surface of the base substrate 1a on the surface, the thickness of the oxide film is preferably limited to 0.5 μm or less. In this regard, in a case where the arithmetic mean roughness Ra of the surface of the oxide film exceeds 0.3 nm, the surface may be smoothed by polishing, etching or the like.

Further, as the method 2, it is preferred that covering layers 1b made of phospho silicate glass (PSG) or boro-phospho silicate glass (BPSG) are formed on both surfaces of the base substrate 1a, and then the covering layers 1b are reflowed to be smooth surfaces of the covering layers, and thus the support substrate 1 is prepared.

In this case, the base substrate 1a may be made of any material of carbon, silicon, silicon carbide, and as the base substrate 1a, even a silicon carbide substrate whose surface is difficult to be smoothed by polishing can be applied. That is, PSG films or BPSG films are formed on both surfaces of the base substrate 1a as covering layers 1b, and then the surfaces are smoothed also by reflowing the films by heating at a high temperature of around 1,000° C., and thus, an expected support substrate 1 can be obtained. Further, in a case where a silicon carbide substrate is used as the base substrate 1a, the covering layers 1b promote the separation between the base substrate 1a and the polycrystalline silicon carbide film, and the polycrystalline silicon carbide film can be separated and taken out. In this regard, the PSG film or the BPSG film may be formed by a conventionally known method, for example, a thermal CVD method.

(Step 2)

Figure 1B:
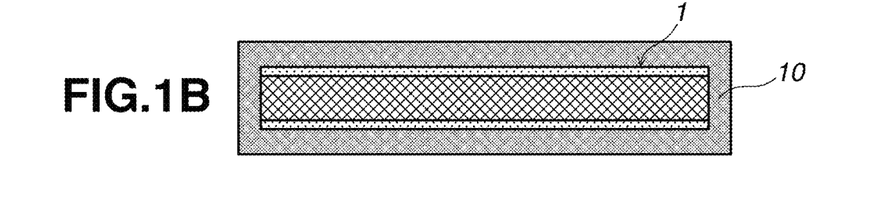
FIG. 1B is a sectional view showing a state that a polycrystalline silicon carbide film is formed on the entire surface of the support substrate.

Next, a polycrystalline silicon carbide film 10 is formed on the entire surface of a support substrate 1 by a vapor deposition method or a liquid phase growth method (FIG. 1B).

In this regard, the formation of the silicon carbide film 10 is preferably performed by a chemical vapor deposition method, and more preferably by a thermal CVD method.
(Formation Example of Silicon Carbide Film)

Herein, a case of using a support substrate 1 in which thermal oxide films are formed as covering layers 1b and 1b on surfaces of a base substrate 1a of a single crystal Si substrate is described.

First, a support substrate 1, which is a wafer whose surfaces are smoothed as described above, is placed on a thermal CVD device.

When the support substrate 1 is placed on the device, only one part in a peripheral part of the wafer is fixed to a rod made of carbon or silicon carbide with a nut so that both surfaces of the support substrate 1 are uniformly exposed to a gas atmosphere. Since the fixed part is only one part, no stress is generated even if there is a thermal expansion coefficient difference between the fixing jig and the wafer, and deformation and residual stress of the wafer are suppressed even after the thermal CVD process.

Next, the temperature of the support substrate 1 is raised up to a specific film forming temperature in an atmospheric-pressure nitrogen atmosphere, and chlorosilane and hydrocarbon are introduced. The introduced chlorosilane is thermally decomposed in a gas phase to generate $SiCl_2$, and the $SiCl_2$ is adsorbed onto covering layers 1b and 1b formed on both surfaces of the support substrate 1. The adsorbed $SiCl_2$ is reduced by hydrogen to form Si. Next, the Si reacts with the hydrocarbon to form silicon carbide on the covering layers 1b and 1b. Further, silicon carbide is formed also on the outer peripheral part of end parts of the support substrate 1. In this regard, if the place is on a single crystal Si substrate, the silicon carbide to be film-formed takes over the crystallinity of the substrate Si, and a (epitaxial growth) single crystal is formed, however, the Si substrate is covered with an amorphous oxide film, and therefore, the epitaxial growth is inhibited, and polycrystalline silicon carbide is formed.

In this regard, in a case where the oxide film (covering layer 1b) is thermally damaged or etched in the above process, the deterioration of the oxide film can be suppressed by intentionally depositing a thin film of polycrystalline silicon carbide at a low temperature or by converting the surface of the oxide film to a silicon carbide film in a hydrocarbon atmosphere, and subsequently, the deposition of polycrystalline silicon carbide may be performed at a high temperature and high speed.

The crystal grains of the polycrystalline silicon carbide to be film-formed form a cubic or hexagonal crystal structure, however, the film is formed such that the most stable crystal plane in terms of energy spreads the surface area, and therefore, the orientation of the crystal grains is not necessarily uniform. If the crystal grains are oriented in a specific direction, the stress of the silicon carbide film is increased or the BOW is generated on the substrate. In view of this, it is preferred to keep the crystal grain size as small as possible, and further to increase the degree of supersaturation in a gas phase so that the crystal grains are oriented in random directions (isotropic orientation). For this reason, the substrate temperature may be in the range of 1,000 to 1,370° C., and more desirably in the range of 1,250 to 1,330° C. In a case where the substrate temperature is low, the film deposition rate (5 μm/h or more) suitable for industrial mass production may not be obtained because of the insufficient decomposition of chlorosilane in a gas phase. On the other hand, in a case where the substrate temperature is extremely high, the lateral growth of crystal grains is promoted to increase the film orientation, and the effect of the present invention may not be able to be exerted. In this regard, in a case where the covering layer 1b is made of PSG or BPSG, the substrate temperature becomes a temperature of the reflow temperature or more, and therefore, it is desirable to heat the substrate in a short time and cover the substrate with polycrystalline silicon carbide.

In addition, as the chlorosilane of a source gas, any one of dichlorosilane, trichlorosilane, and tetrachlorosilane can be selected, however, a mixed gas of silane or disilane and hydrogen chloride can be used as a substitute for the chlorosilane. In a case where dichlorosilane is used as the chlorosilane, introduction of the dichlorosilane is performed desirably at a flow rate of 50 to 500 sccm, and more desirably at a flow rate of 100 to 300 sccm. In a case where the flow rate is too low, not only a sufficient film deposition rate cannot be obtained but also the supersaturation rate is decreased and the film is well oriented, and the internal stress in the film may be increased, or the BOW may be generated on the substrate. Further, in a case where the flow rate is too high, the amount of generated $SiCl_2$ in a gas phase becomes excessive, and which may cause Si microcrystals to be mixed in the film. On the other hand, as the hydrocarbon, methane, ethane, acetylene, propane or the like can be used, and it is desirable to use acetylene that is the most stable in the temperature range described in the present embodiment. In a case of using acetylene in combination with dichlorosilane, the ratio of the number of atoms of Si to the number of atoms of C, to be introduced is desirably silicon carbide (Si/C)=1.5 to 3.5, and more desirably 2.0 to 3.0. In a case where this ratio is too large, the amount of reaction precursor of Si becomes excessive, and microcrystals of Si may be included in the silicon carbide film. On the other hand, in a case where this ratio is too small, a problem that etching on a surface of a substrate is promoted or graphite is deposited may be caused.

In the above-described thermal CVD process, the surface of a wafer (support substrate 1) is exposed to a chloridation atmosphere or a carbonization atmosphere, however, the surface is covered with an oxide film resistant to oxidation and chloridation as a covering layer 1b, and therefore, the generation of etch pits is suppressed, and the smoothness as an interface to a polycrystalline silicon carbide film is maintained without being affected by thermal roughening.

In the above-described most suitable CVD condition range, a silicon carbide polycrystalline film oriented in random directions (isotropically) is obtained, and regardless of the orientation of a surface of a Si substrate, the volume ratio of crystal grains for orienting the close-packed plane to a solid angle within ⅓ π steradian from the normal axis of the substrate is half or less of the volume of the total constituent crystal grains. The orientation distribution of the crystal can be quantitatively calculated from a rocking curve or polar coordinates by an X-ray diffraction method, electron backscatter diffraction (EBSD), or the like.

The thickness of a silicon carbide film 10 to be formed on front and back main surfaces of a support substrate 1 is preferably 50 μm or more so that sufficient mechanical strength can be maintained by itself even after the support substrate 1 is removed, and further, more preferably 150 μm or more.

(Step 3)

Figure 1C:
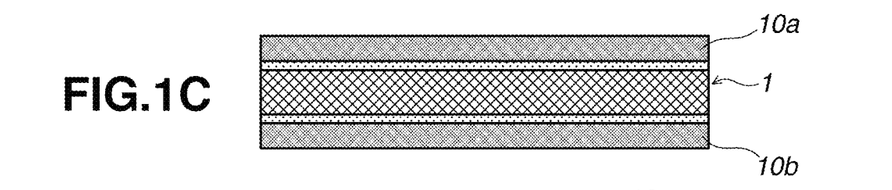
FIG. 1C is a sectional view showing a state that a polycrystalline silicon carbide film at the end parts of the support substrate is removed.

Next, the silicon carbide film deposited to the end parts of a support substrate 1 in the silicon carbide film 10 is removed by grinding to expose the end faces of the support substrate 1 (FIG. 1C).

At this time, the silicon carbide film on the end parts of the support substrate 1 may be removed by cutting with a diamond wheel or by grinding with abrasive grains. As a result, the end faces of the support substrate 1 are exposed, and at the same time, a state that silicon carbide substrates 10*a* and 10*b* being silicon carbide films are present on front and back main surfaces of the support substrate 1 is obtained.

(Step 4)

Figure 1D:
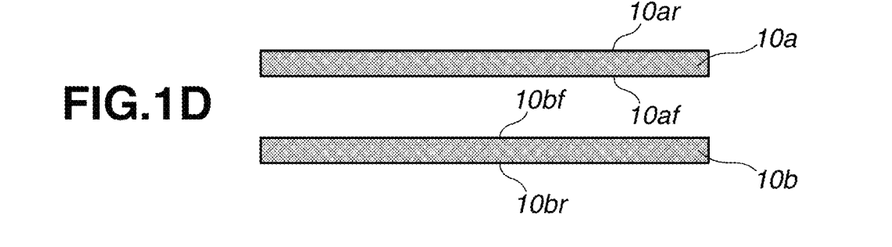
FIG. 1D is a sectional view showing a state that polycrystalline silicon carbide films are taken out as silicon carbide substrates.

Next, the polycrystalline silicon carbide films are separated from the support substrate 1 in a state of reflecting the smoothness of surfaces of the covering layers 1*b* on the surfaces of the polycrystalline silicon carbide films by chemically removing at least the covering layers 1*b* and 1*b* in the support substrate 1, and the polycrystalline silicon carbide films are obtained as silicon carbide substrates 10*a* and 10*b* (FIG. 1D).

In this regard, as a method of separating the polycrystalline silicon carbide films from the support substrate 1, the entire support substrate 1 may be chemically removed to take out the polycrystalline silicon carbide films, or the covering layers 1*b* and 1*b* in the support substrate 1 may be chemically removed and the polycrystalline silicon carbide films may be separated from the base substrate 1*a*.

That is, in a case where the support substrate 1 is a support substrate in which thermal oxide films are formed on surfaces of the above-described base substrate 1*a* of a single crystal Si substrate as covering layers 1*b* and 1*b*, a laminated substrate with the constitution shown in FIG. 1C is favorably immersed in a mixed acid of a hydrogen fluoride solution and a nitric acid solution to remove the entire support substrate 1, that is, the Si substrate and the thermal oxide films by etching. At this time, each of the polycrystalline silicon carbide films deposited on the front and back surfaces of the support substrate 1 has sufficient chemical resistance, and can be collected as a single film without being etched. Further, the polycrystalline silicon carbide films are deposited on both surfaces of the support substrate 1, and therefore, two polycrystalline silicon carbide films can be obtained as silicon carbide substrates 10*a* and 10*b* per substrate by this etching.

Further, in a case where the base substrate 1*a* is made of a carbon substrate in a support substrate 1, the carbon is favorably oxidized and removed by heating in the atmospheric air, and the remaining covering layer 1*b* may be removed by chemical etching.

In addition, in a case where the base substrate 1*a* is made of a silicon carbide substrate in a support substrate 1, the covering layers 1*b* and 1*b* are chemically etched and removed from the end faces of the support substrate 1 and the silicon carbide films are favorably separated from the base substrate 1*a*.

In a case where the covering layers 1*b* and 1*b* are chemically etched and removed, as the preferable etching solution, the following ones are mentioned.

For example, in a case where the covering layers 1*b* each made of silicon oxide are chemically etched and removed, as the etching solution, a mixed acid of a hydrogen fluoride solution and a nitric acid solution is favorably used.

Further, in a case where the covering layers 1*b* each made of silicon nitride are chemically etched and removed, as the etching solution, phosphoric acid (at a solution temperature of 150° C. or more) is favorably used.

In addition, in a case where the covering layers 1*b* each made of silicon carbonitride are chemically etched and removed, as the etching solution, molten KOH or molten NaOH (at a solution temperature of 400° C. or more) is favorably used.

Further, in a case where the covering layers 1*b* each made of silicide are chemically etched and removed, any one is favorably appropriately selected from sulfuric acid ($H_2SO_4$), nitric acid ($HNO_3$), phosphoric acid ($H_3PO_4$), phosphonic acid ($H_3PO_3$), and a mixed acid of an organic acid depending on the metal constituting the silicide, and favorably used as the etching solution.

In addition, in a case where the covering layers 1*b* each made of phospho silicate glass or boro-phospho silicate glass are chemically etched and removed, as the etching solution, an aqueous solution of around 48% by weight of hydrofluoric acid aqueous solution (hydrofluoric acid) is favorably used.

The newly exposed, uncovered surfaces 10*af* and 10*bf* of the silicon carbide substrates 10*a* and 10*b*, respectively, obtained as described above, which have been in contact with the covering layers 1*b* and 1*b*, reflect the shape (smoothness) of the surfaces of covering layers 1*b*, and therefore, a polycrystalline silicon carbide substrate having a smoothness of 0.3 nm or less in arithmetic mean roughness Ra can be obtained without passing through a complicated polishing process.

Further, the grain size of the crystal grains constituting the silicon carbide substrates 10*a* and 10*b* is in the range of 10 nm to 10 μm, desirably in the range of 100 nm to 5 μm, and more desirably in the range of 100 nm to 2 μm. If the crystal grain size is in this range, the increase in the resistivity of the film can be suppressed, and the loss at the time of using as a substrate of a power device can be reduced. In addition, the orientation of the crystal can be suppressed, and the localization of stress can be suppressed.

Further, the orientations of the crystal grains constituting the silicon carbide substrates 10*a* and 10*b* are isotropic and the glide of dislocations is hindered, and therefore, the generation of stress can also be suppressed to 100 MPa or less, and the BOW and deformation of the silicon carbide substrates can also be suppressed. In general, a crystalline film causes deformation and stress changes due to the glide of dislocations. In a case where the crystal grains are isotropically oriented, however, the glide direction of dislocations is also isotropic, further the glide of dislocations is hindered at the crystal grain boundary, and therefore, the deformation and stress distribution are suppressed. In this regard, the stress and roughness of the polycrystalline film are affected by the crystal grain size, however, the crystal grain size can be optionally controlled by the temperature and pressure at the time of deposition.

As described above, according to the method for producing a silicon carbide substrate of the present invention, a polycrystalline silicon carbide substrate that is excellent in the flatness and smoothness and has reduced internal stress can be realized.

EXAMPLES

Hereinafter, the present invention is more specifically described by referring to Examples and Comparative Examples, however, the present invention is not limited at all by these Examples. In this regard, the arithmetic mean roughness Ra was calculated by the formula of arithmetic mean roughness Ra defined by JIS B0601: 2013 on the basis of the surface profile (profile curve) data obtained by the measurement with the use of an atomic force microscope (AFM). Note that the surface profile (profile curve) at this time was a profile in a cross-section direction where the unevenness was as large as possible when the texture on a surface of the sample to be targeted was observed.

EXAMPLE 1

A silicon carbide substrate was prepared by the procedure shown in FIGS. 1A to 1D.

First, as a base substrate 1a, a single crystal silicon substrate having a diameter of 3 inches, a thickness of 400 μm, and a surface of (100) plane was used. Both surfaces of the silicon substrate were polished, and the arithmetic mean roughness Ra of the substrate surface was 0.1 nm.

Next, the silicon substrate was subjected to a wet oxidation treatment at 1,100° C., and thermal oxide films each having a thickness of 0.5 μm were formed as covering layers 1b and 1b on the front and back surfaces of the substrate to prepare a support substrate 1. In this case, the surfaces of the covering layers 1b and 1b (thermal oxide films) reflect the smooth surfaces of the base substrate 1a (silicon substrate), and the arithmetic mean roughness Ra of the surface of the support substrate 1 was 0.3 nm or less.

Next, the silicon carbide film was formed on the support substrate 1 by using a thermal CVD method under the following conditions.
(Film Forming Conditions)
 Film forming temperature: 1,300° C.,
 Pressure: 11 Pa, and
 Introduced gas: 200 sccm of dichlorosilane, 50 sccm of acetylene, and 3 slm of hydrogen.

A cubic silicon carbide film 10 having a thickness of 300 μm was formed by film formation for 6 hours.

Next, the silicon carbide film deposited to the end parts of the support substrate 1 was removed by grinding to expose the end faces of the support substrate. After that, the sample was immersed in a mixed acid of hydrofluoric acid and nitric acid to remove the whole of the support substrate 1. As a result of removing the support substrate 1, silicon carbide substrates 10a and 10b each having a thickness of 300 μm and being free standing were obtained.

Figure 2:
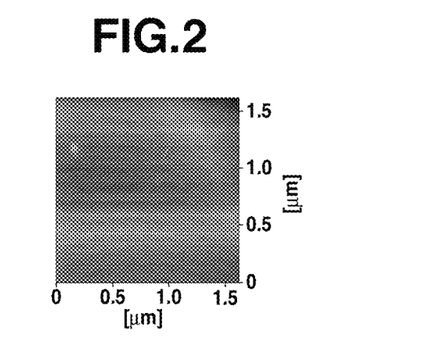
FIG. 2 is an atomic force microscope (AFM) image on a surface of the silicon carbide substrate of Example 1.
Figure 3:
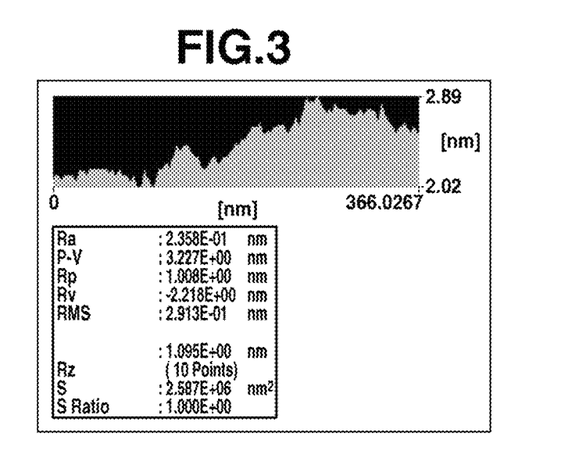
FIG. 3 is a diagram showing a surface profile of the silicon carbide substrate of Example 1.

When the newly exposed, uncovered surfaces 10af and 10bf of the silicon carbide substrates 10a and 10b, respectively, which had been in contact with the covering layers 1b of the support substrate 1, were observed by using an atomic force microscope (AFM), a morphology of the surface texture shown in FIG. 2 and the surface profile shown in FIG. 3 (a roughness profile curve, in the drawing, the horizontal axis is the position of the sample surface, and the vertical axis is the height of the roughness profile curve (the same applies hereinafter)) was observed, and it was found that the arithmetic mean roughness Ra was 0.24 nm. The surface roughness data are shown together with the surface profile in FIG. 3 (hereinafter, the same applies).

Further, when a rocking curve of the (111) plane of the 3C-SiC crystal constituting the silicon carbide substrate based on the normal axis of the surface of the silicon carbide substrate was taken by an X-ray rocking curve method (ω scan) using an X-ray diffraction system (SuperLab manufactured by Rigaku Corporation, Cu bulb), no remarkable peak was found, and it was found that the crystal grains in which the close-packed plane was oriented at a solid angle of ⅓ 7 π steradian from the normal axis of the substrate were polycrystals of 17% or less of the whole. In this regard, the grain size of the crystal grains of the silicon carbide substrate was 110 to 600 nm.

In addition, an optical flat was placed on the above free-standing silicon carbide substrates 10a and 10b, and when the radius of curvature was determined from the interval of Newton rings formed by optical interference, 103 m was obtained, and it was found that the value of BOW was reduced to 27 μm for a 6-inch wafer.

Further, when a rocking curve of the (111) plane of the 3C—SiC crystal constituting the silicon carbide substrate based on the normal axis of the surface of the silicon carbide substrate was taken by an X-ray rocking curve method (ω scan) using an X-ray diffraction system (SuperLab manufactured by Rigaku Corporation, Cu bulb), no remarkable peak was found, and it was found that the crystal grains in which the close-packed plane was oriented at a solid angle of ⅓ π steradian from the normal axis of the substrate were polycrystals of 17% or less of the whole. In this regard, the grain size of the crystal grains of the silicon carbide substrate was 110 to 600 nm.

In addition, an optical flat was placed on the above free-standing silicon carbide substrates 10a and 10b, and when the radius of curvature was determined from the interval of Newton rings formed by optical interference, 103 m was obtained, and it was found that the value of BOW was reduced to 27 μm for a 6-inch wafer.

EXAMPLE 2

A silicon carbide substrate was prepared by the procedure shown in FIGS. 1A to 1D.

First, as a base substrate 1a, a high-purity carbon substrate having a diameter of 3 inches and a thickness of 400 μm was used. The arithmetic mean roughness Ra of the surface of the carbon substrate was 2.3 nm.

Next, boro-phospho silicate glass (BPSG) films each having a thickness of 1 μm were deposited on the front and back surfaces of the carbon substrate as covering layers 1b and 1b by a CVD method. Subsequently, by heating to 900° C. in an argon gas atmosphere, the covering layers 1b and 1b were reflowed to obtain a support substrate 1 with smoothed surfaces. The arithmetic mean roughness Ra of the surface of this support substrate 1 was 0.2 nm.

Next, a silicon carbide film having a thickness of 300 μm was formed on the support substrate 1 under the same conditions as in Example 1 by using a thermal CVD method.

Subsequently, the silicon carbide film deposited to the end parts of the support substrate 1 was removed by grinding to expose the end faces of the support substrate 1. After that, the part of the carbon substrate was removed by heating the sample at 900° C. for 24 hours in the atmospheric air, and further the BPSG films of the covering layers 1b were removed with a hydrofluoric acid solution. As a result of removing the support substrate 1, silicon carbide substrates 10a and 10b each having a thickness of 300 μm and being free standing were obtained.

Figure 4:
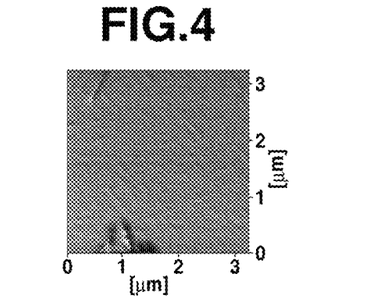
FIG. 4 is an AFM image on a surface of the silicon carbide substrate of Example 2.
Figure 5:
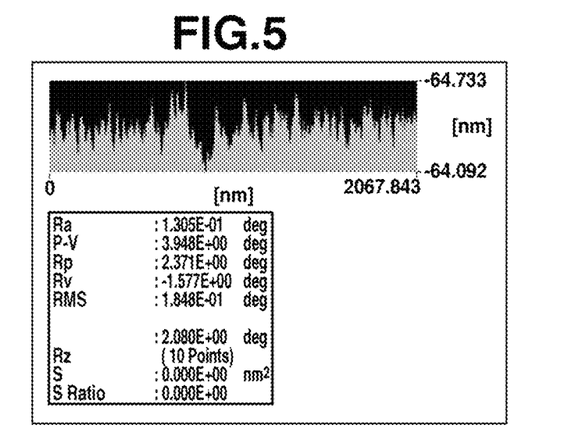
FIG. 5 is a diagram showing a surface profile of the silicon carbide substrate of Example 2.

When the newly exposed, uncovered surfaces 10af and 10bf of the silicon carbide substrates 10a and 10b, respectively, which had been in contact with the covering layers 1b of the support substrate 1, were observed by using an atomic force microscope (AFM), the morphology of the surface texture shown in FIG. 4 and the surface profile shown in FIG. 5 was observed, and it was found that the arithmetic mean roughness Ra was 0.13 nm.

Further, in a similar manner as in Example 1, when a rocking curve of the crystal of the silicon carbide substrate was measured, no remarkable peak was found, and it was found that the crystal grains in which the close-packed plane was oriented at a solid angle of ⅓ π steradian from the normal axis of the substrate were polycrystals of 17% or less of the whole. In this regard, the grain size of the crystal grains of the silicon carbide substrate was 160 to 820 nm.

Further, an optical flat was placed on the above free-standing silicon carbide substrates 10a and 10b, and when the radius of curvature was determined from the interval of Newton rings formed by optical interference, 95 m was obtained, and it was found that the value of BOW was reduced to 30 µm for a 6-inch wafer.

Comparative Example 1

As a support substrate, a single crystal silicon substrate having a diameter of 3 inches, a thickness of 400 µm, and a surface of (100) plane was used. Both surfaces of the silicon substrate were polished, and the arithmetic mean roughness Ra of the substrate surface was 0.1 nm.

A silicon carbide film having a thickness of 300 µm was formed on the support substrate under the same conditions as in Example 1 by using a thermal CVD method.

Next, the silicon carbide film deposited to the end parts of the support substrate was removed by grinding to expose the end faces of the support substrate. After that, the sample was immersed in a mixed acid of hydrofluoric acid and nitric acid to remove the part of the silicon substrate. As a result of removing the substrate, silicon carbide substrates each having a thickness of 300 µm and being free standing were obtained.

Figure 6:
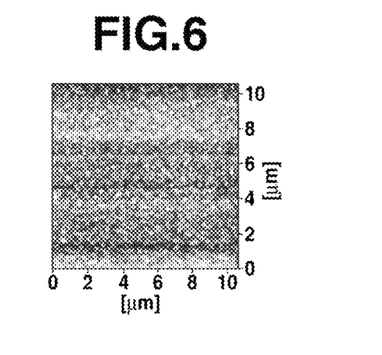
FIG. 6 is an AFM image on an abutting surface with a silicon substrate of the silicon carbide substrate of Comparative Example 1.
Figure 7:
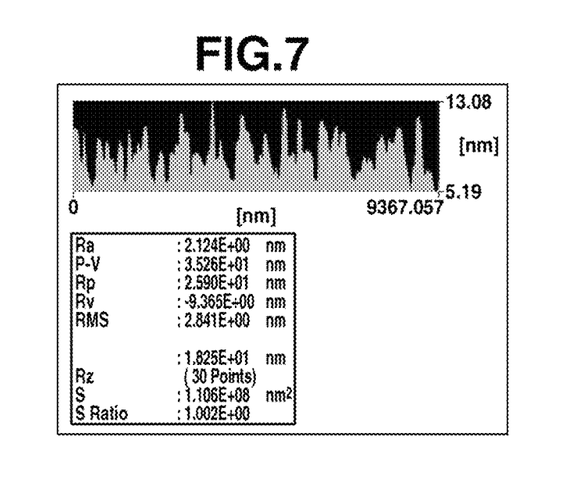
FIG. 7 is a diagram showing a surface profile of an abutting surface with a silicon substrate of the silicon carbide substrate of Comparative Example 1.

When the surfaces of the silicon carbide substrates, which had been in contact with the silicon substrate, were observed by using an atomic force microscope (AFM), the morphology of the surface texture shown in FIG. 6 and the surface profile shown in FIG. 7 was observed, and it was found that the arithmetic mean roughness Ra was 2.1 nm.

Further, in a similar manner as in Example 1, when a rocking curve of the crystal of the silicon carbide substrate was measured, a sharp peak was observed with the (111) plane at the pole, and it was found that the crystal was a single crystal in which 90% or more of the close-packed plane was oriented within 100 arcsec around the normal axis of the surface.

In addition, an optical flat was placed on the above free-standing substrates, and when the radius of curvature was determined from the interval of Newton rings formed by optical interference, 8 m was obtained, and it was found that the value of BOW was 350 µm for a 6-inch wafer.

Figure 8:
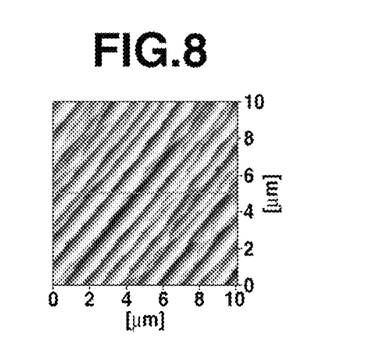
FIG. 8 is an AFM image on a surface after CMP treatment of the silicon carbide substrate of Comparative Example 1.
Figure 9:
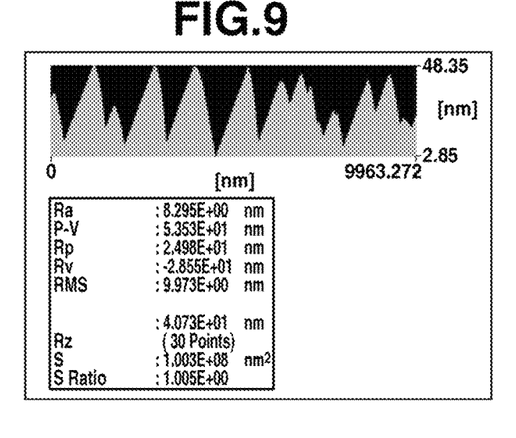
FIG. 9 is a diagram showing a surface profile after CMP treatment of the silicon carbide substrate of Comparative Example 1.

Next, the surfaces of the above silicon carbide substrate, which had been in contact with the silicon substrate, were subjected to a CMP treatment using colloidal silica for 3 hours, and when the resultant surfaces were observed by using an AFM, the morphology of the surface texture shown in FIG. 8 and the surface profile shown in FIG. 9 was observed, and it was found that the arithmetic mean roughness Ra was 8.3 nm.

Comparative Example 2

As a support substrate, a high-purity carbon substrate having a diameter of 3 inches, a thickness of 400 µm, and an arithmetic mean roughness Ra of the substrate surface of 2.3 nm was used. A silicon carbide film having a thickness of 300 µm was formed on the substrate under the same conditions as in Example 1 by using a thermal CVD method.

Figure 10:
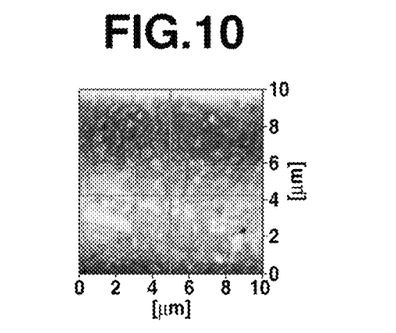
FIG. 10 is an AFM image on an abutting surface with a carbon substrate of the silicon carbide substrate of Comparative Example 2.
Figure 11:
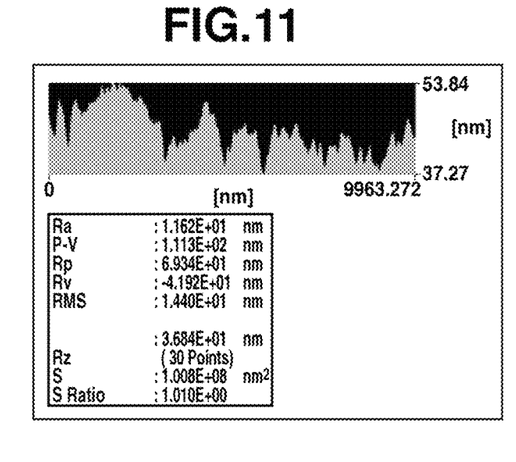
FIG. 11 is a diagram showing a surface profile of an abutting surface with a carbon substrate of the silicon carbide substrate of Comparative Example 2.

Next, the silicon carbide film deposited to the end parts of the support substrate was removed by grinding to expose the end faces of the support substrate. After that, the part of the carbon substrate was removed by heating the sample at 900° C. for 24 hours in the atmospheric air. As a result of removing the substrate, silicon carbide substrates each having a thickness of 300 µm and being free standing were obtained. When the surfaces of the silicon carbide substrates, which had been in contact with the carbon substrate, were observed by using an atomic force microscope (AFM), the morphology of the surface texture shown in FIG. 10 and the surface profile shown in FIG. 11 was observed, and it was found that the arithmetic mean roughness Ra was 11.6 nm. Further, in a similar manner as in Example 1, when a rocking curve of the crystal of the silicon carbide substrate was measured, no remarkable peak was found, and it was found that the crystal grains in which the close-packed plane was oriented at a solid angle of $\frac{1}{3}$ π steradian from the normal axis of the substrate were polycrystals of 17% or less of the whole.

In this regard, the grain size of the crystal grains of the silicon carbide substrate was 210 to 2,040 nm.

Further, an optical flat was placed on the above free-standing silicon carbide substrates, and when the radius of curvature was determined from the interval of Newton rings formed by optical interference, 98 m was obtained, and it was found that the value of BOW was reduced to 29 µm for a 6-inch wafer.

Figure 12:
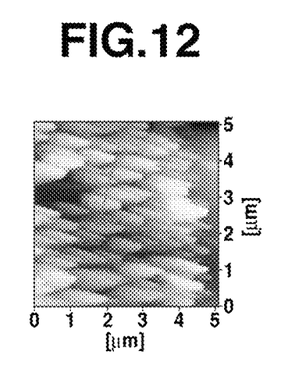
FIG. 12 is an AFM image on a surface after CMP treatment of the silicon carbide substrate of Comparative Example 2.
Figure 13:
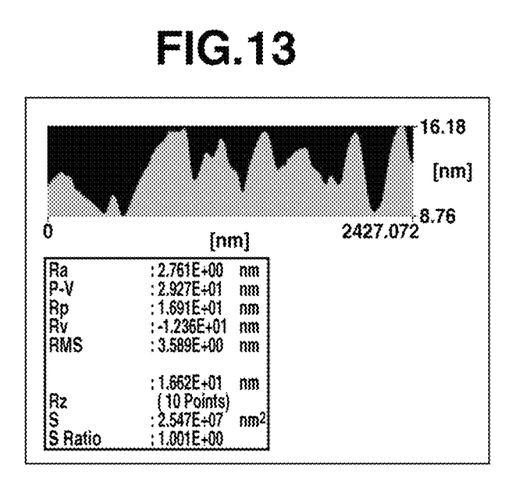
FIG. 13 is a diagram showing a surface profile after CMP treatment of the silicon carbide substrate of Comparative Example 2.

Next, the surfaces of the above silicon carbide substrate, which had been in contact with the carbon substrate, were subjected to a CMP treatment using colloidal silica for 3 hours, and when the resultant surfaces were observed by using an AFM, the morphology of the surface texture shown in FIG. 12 and the surface profile shown in FIG. 13 was observed, and it was found that the arithmetic mean roughness Ra was 2.8 nm.

As described above, each of the silicon carbide substrates obtained in Examples 1 and 2 achieved an arithmetic mean roughness of 0.3 nm or less although the substrates were not polished, and further the volume of the crystal grains in which the close-packed plane was oriented at a solid angle within $\frac{1}{3}$ π steradian from the normal axis of the substrate was half or less of the volume of the total constituent crystal grains, and therefore, it was revealed that the substrate was a substrate in which deformation due to the movement of defects such as dislocations was suppressed.

Note that the present invention has been described with the use of the above embodiment so far, however, the present invention is not limited to the embodiment, and can be modified within the scope in which those skilled in the art can usually perform other embodiments, additions, modifications, deletions, or the like, and in any aspect, the embodiment is included within the scope of the present invention as long as it exerts the effects of the present invention. That is, in the present invention, the covering layer is not limited to the films of silicon oxide and BPSG shown in Examples, and any film can obtain similar effects as long as it has sufficient heat resistance, oxidation resistance and smoothness, and the production method is also not limited. In addition, the film forming method of the polycrystalline silicon carbide film is not limited to the combination of silicon chloride and hydrocarbon gas, and the similar effects of the present invention can be obtained also in a sublimation method and a solution method.

REFERENCE SIGNS LIST 1 support substrate
1a base substrate
1b covering layer
10, 92 silicon carbide film
10a, 10b silicon carbide substrate 10*af*, 10*bf*, 92*f* front surface
10*ar*, 10*br*, 92*r* back surface
91 silicon substrate
91*p* etch pits
93 protrusions

The invention claimed is:

1. A method for producing a silicon carbide substrate, comprising steps of:

providing covering layers each containing silicon oxide, silicon nitride, silicon carbonitride or silicide on both surfaces of a base substrate made of carbon, silicon or silicon carbide to prepare a support substrate having the covering layers each with a smooth surface that has an arithmetic mean roughness Ra of 0.3 nm or less;

forming polycrystalline silicon carbide films on both surfaces, each being the smooth surface of a corresponding one of the covering layers, of the support substrate by a vapor deposition method or a liquid phase growth method; and chemically removing at least the covering layers in the support substrate to separate the polycrystalline silicon carbide films from the support substrate such that a newly exposed, uncovered surface of each polycrystalline silicon carbide film, which has been in contact with the smooth surface of the corresponding one of the covering layers, has an arithmetic mean roughness Ra of 0.3 nm or less, and obtaining the polycrystalline silicon carbide films as silicon carbide substrates each having a crystal grain size of 10 nm or more and 10 μm or less, and an arithmetic mean roughness Ra of at least one of its main surfaces, being the newly exposed, uncovered surface, of 0.3 nm or less.

2. The method for producing a silicon carbide substrate according to claim 1, wherein the support substrate is prepared by smoothing the both surfaces of the base substrate, and forming the covering layers made of silicon oxide, silicon nitride, silicon carbonitride or silicide on the smoothed both surfaces of the base substrate, wherein the smoothed both surfaces of the base substrate exhibit an arithmetic mean roughness Ra of 0.1 nm or less.

3. The method for producing a silicon carbide substrate according to claim 1, wherein the support substrate is prepared by forming covering layers made of phospho silicate glass or boro-phospho silicate glass on the both surfaces of the base substrate, and reflowing the covering layers so as to form the smooth surface of each of the covering layers.

4. The method for producing a silicon carbide substrate according to claim 1, wherein the polycrystalline silicon carbide films are formed by a thermal CVD method.

* * * * *